United States Patent [19]
Green

[11] 3,958,239
[45] May 18, 1976

[54] CAPACITIVE TRANSISTORIZED SIGNALING DEVICE

[76] Inventor: Robert E. Green, 1105 E. Oxford, Santa Ana, Calif. 94903

[22] Filed: Sept. 27, 1973

[21] Appl. No.: 401,261

Related U.S. Application Data

[63] Continuation-in-part of Ser. No. 237,619, March 24, 1972.

[52] U.S. Cl. .................... 340/365 R; 340/365 C
[51] Int. Cl.² ............................................ G08C 9/02
[58] Field of Search .......... 340/365 S, 365 C, 365 R; 178/19, 17 C; 179/90 K; 197/98; 200/DIG. 1

[56] References Cited
UNITED STATES PATENTS

| | | | |
|---|---|---|---|
| 3,631,472 | 12/1970 | Lincoln | 340/365 C |
| 3,691,555 | 9/1972 | Looschen | 340/365 C |
| 3,696,409 | 10/1972 | Braaten | 340/365 C |

*Primary Examiner*—Harold I. Pitts

[57] ABSTRACT

An electronic device incorporating a circuit for providing a signal with respect to an on or off mode dependent upon the degree of capacitance. The invention comprises a first and basic embodiment utilizing a signal source having a slope of a step function or specifically one having a fast rise time initiated for example by a clock element. The operative signal criteria demands that the length and slope thereof respectively have an effective amplitude and an effective frequency compatible with the circuit components.

The signal source is fed to a transistor or suitable amplifier having its base connected to a capacitance sensing means. Resistors are provided for appropriate biasing, current limiting and drain functions as well as capacitors for capacitance balancing purposes. The capacitance sensing means can comprise a touch switch which when touched has its capacitance increased causing the device to function. The transistor or amplifier is connected to a load so that when a change of capacitance is sensed, the change will be registered. Other embodiments can incorporate differential amplification means and means to drive the active components with the voltage of the signal source or the clock voltage.

Alternative embodiments of this invention incorporate capacitance sensing means in the form of transducers which can operate in a linear or a sequential mode. The transducers functionally incorporate a change of capacitance by means of moving mechanical elements so that when such change in capacitance is detected by the circuit it will provide an on or off sensing for the circuit or an analog of the change in capacitance. Thus, a reading of the extent of mechanical movement of a mechanically moving object can be transduced into an electrical function or output having substantial linearity.

In summation, the circuit of this invention can be used for a transducer, or a solid state switch.

25 Claims, 16 Drawing Figures

CAPACITIVE TRANSISTORIZED SIGNALING DEVICE

This case is a continuation-in-part of my previous case entitled Capacitive Transistorized Signaling Device, filed Mar. 24, 1972, and bearing Ser. No. 237,619.

BACKGROUND OF THE INVENTION

1. Field of the Invention

The field of this invention lies within the switch art, and the art related to electrically sensing mechanical movement through electrical outputs related thereto.

2. The Prior Art

The prior art relating to switches incorporates limited touch type non-mechanical or solid state switches, toggle switches, and microswitches. In most cases, switching is performed by limiting or ceasing the flow of current through a mechanical contact. However, in some touch type switches switching is performed without the use of mechanical contacts. It is well known to ionize a gas and create conduction therethrough to provide a signal or means for allowing the total conduction of the required signal. For example, neon gas tubes are provided with a voltage level whereby the gas will not conduct until the gas ionizes. At this point, a signal passes thereby creating a switching function.

Other solid state switches incorporate photoelectric means for purposes of activating a light detection means to create a situation whereby a switching function will occur. Still other solid state switches employ an interruption or conduction of light by means of optical means which then create a signal which is used to cause a switching function to take place.

In the above solid state switches, complex movements and actuations must take place before a signal emanates for switching purposes. It is this movement which often causes such signals to be inaccurate and not perform the function of switching to the desired mode. Furthermore, the aggregation of elements necessary to create prior art solid state switches is complex and detailed, thus making them extremely expensive. The expense is oftentimes increased by the fact that various electron tubes and other active and passive components must be provided which do not have anything specifically to do with the switching function but are only utilized to register a signal.

As can be appreciated, solid state switching is extremely useful to prevent contact chattering and unwanted line spikes. This invention provides a solid state switch which is less expensive than prior art switches and provides superior results.

Prior art transducers oftentimes produce an electrical signal analogous to certain mechanical movements so that a signal is created to show an on or off mode, a proportionate movement, an analog movement, or a linear movement. Such transducers do not provide a great degree of linearity and are not in an inexpensive form required in many applications. As a consequence, the use of transducers is limited and when required oftentimes creates a difficult design problem with substantial expense.

This invention provides a transducer having excellent linearity which can be used in numerous applications and is relatively cheap.

The switch and transducer of this invention utilize a fast rising signal preferably having the slope of a step function emanating from a signal source such as a clock. The signal source causes a transistor to turn on or off depending upon the degree of capacitance in the capacitance sensing means. The device incorporates a circuit wherein a switching or transduction of a certain mechanical movement can be easily registered and an analogous signal with respect thereto provided. The switch of this invention is of a highly reliable form and overcomes many of the switching problems associated with the prior art. In addition thereto, the switch can perform in a cheaper and more adaptable manner thereby replacing current state of the art microswitches, switches utilized for analog functions, keyboards for electronic equipment, as well as general computerized switching functions.

As a transducer this invention provides a highly linear output. Furthermore, the transducer can be configured to meet various needs such as the measurement of liquid levels, the movement of precision apparatus and many other needs where certain mechanical movements must be converted to electrical outputs.

The prior art shows that the signal can be changed by means of amplitude. However, in most cases, they need a threshold detector. Applicant's invention substantially provides a signal having its full amplitude.

In effect, the applicant's invention is actually a large phase modulator. The applicant's invention which is a phase modulator, or frequency modulator, has the advantage in that it utilizes a single pulse technique. It saves substantial power, and the limitations with regard to the total energy of the system is lower. Furthermore, applicant's invention is universal with respect to current digital techniques, and works under most conditions therein.

SUMMARY OF THE INVENTION

In summation, this invention comprises a device to create a signal based upon changes in capacitance.

Specifically, this invention in its simplest form creates a signal output when a capacitance change is recognized by means of causing a transistor or amplifier within a circuit having a signal source with the slope of a step function to perform. The switch embodiment has a capacitance recognition device which is fed by a signal having the slope of a step function or fast rising signal wave form in conjunction with a transistor or amplifier. In its alternative embodiments, the signal source can be formulated by various means and can be utilized as the power source for the switch. Also, the switching requirements of a computer keyboard or other device having a clock or signal with the slope of a step function can have such signal sources utilized with this invention as the signal source. Furthermore, alternative balancing and temperature compensation means can be utilized such as differential amplifiers.

An alternative form of this invention provides a transducer which signals changes in capacitance with respect to its mechanical elements. The changes in capacitance affect a supply signal with a slope of a step function so that the changes in capacitance in either a proportional, analog, linear, or on-off manner can be recognized. This provides an appropriate signal to indicate changes in movement or on-off modes.

This invention will become more apparent as to its breadth and capability of solving many problems in conjunction with the following specification.

BRIEF DESCRIPTION OF THE DRAWINGS

The invention will be more clearly understood by reference to the description, taken in conjunction with the accompanying drawing wherein:

FIG. 6 is a schematic showing of a circuit that can be utilized in combination with the transducers of this invention;

FIG. 7 is a schematic showing of a material or liquid level transducer that can be utilized with the circuit of FIG. 6;

FIG. 8 is a schematic showing of a transducer incorporated in a form of this invention;

FIG. 9 is another form of a transducer that is utilized with this invention;

FIG. 10 is a schematic showing of a bimetal or diaphragmatic recorder which can record pressure or temperature changes utilizing the transduction features of this invention;

FIG. 11 is a schematic showing of a series of transducers that can record movement of a particular body thereover;

FIG. 12 is a schematic showing of a keyboard touch switch;

FIG. 13 is a schematic showing of this invention in a form that will record certain levels of movement of a plunger without the requirement of the plunger being electrically connected;

THE PREFERRED EMBODIMENTS

The Basic Switch

Figures 1, 2, 3, 4, 5, 14, 16:
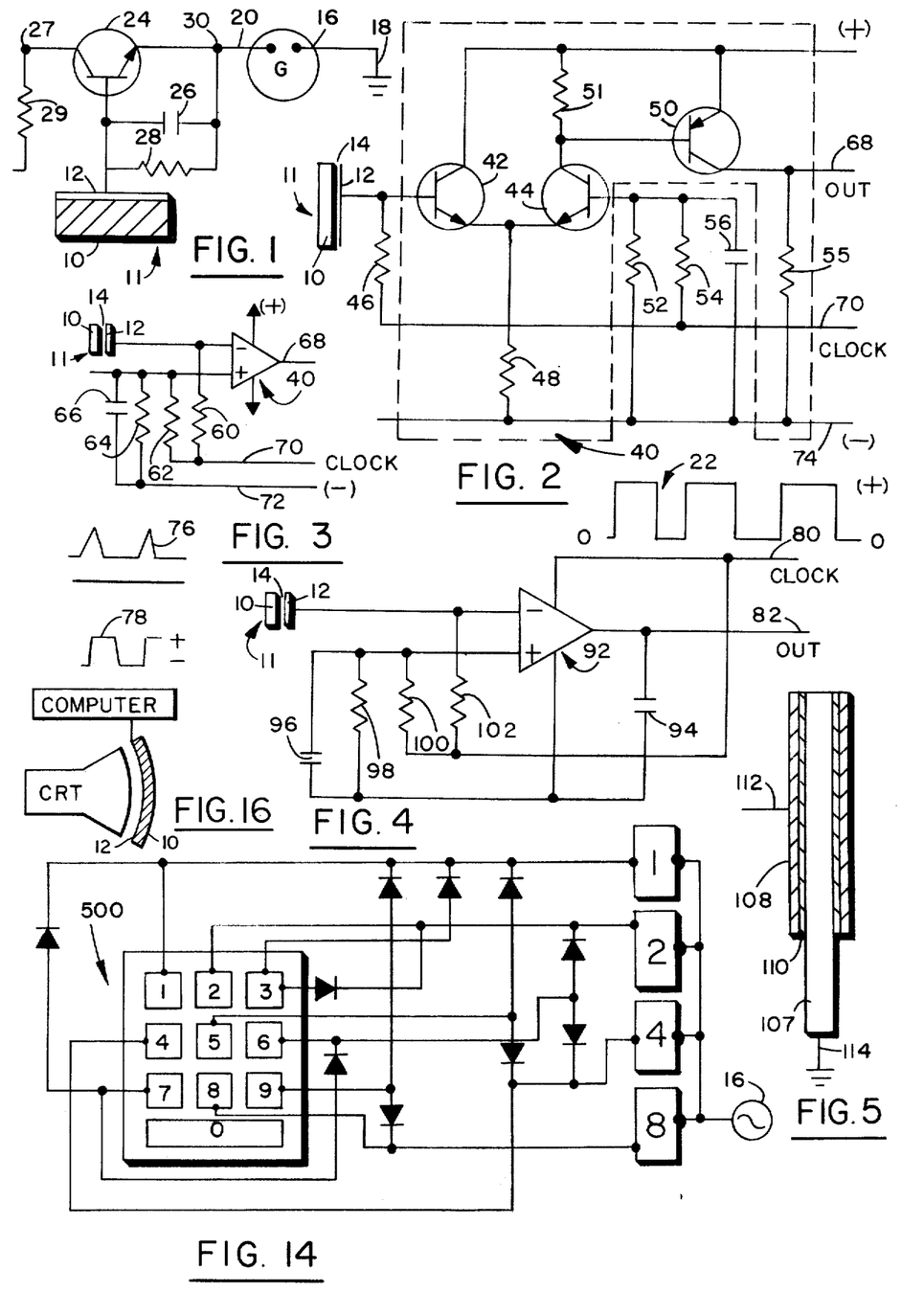
FIG. 1 is a schematic showing of the invention in its simplest form.
FIG. 2 is a schematic showing of the invention incorporating certain compensation factors.
FIG. 3 is a schematic showing in block form of the differential amplifier which may be utilized with this invention.
FIG. 4 is a schematic showing of this invention utilizing the signal source as the supply voltage therefor.
FIG. 5 is a cross sectioned view of a schematic representation of a transducer that can be utilized in a form of this invention.
FIG. 14 shows the use of a diode decode matrix in combination with this invention to provide a calculator keyboard; and, FIG. 15 shows a schematic view of an alternative liquid or material level transducer.
FIG. 16 shows a schematic computer and CRT utilizing the switching device of this invention.

Looking specifically at FIG. 1, a basic configuration of this invention is shown having a touch or covering plate 10 which can be formed of any suitable material such as a plastic, and functions as a visible switch plate. It is common in some instances for touch switches to be recessed such as those provided for elevators. Thus, the plate 10 can be recessed or protected from accidental contact by a raised edge or movable cover thereover.

A metal plate 12 is placed in juxtaposition to the touch plate 10. The touch plate 10 effectively acts as a dielectric for insulating the conductive plate 12 from contact with any outside sources external to the configuration beyond plate 10. In order to effectively create an increase in capacitance, when one touches the plate 10, a storage of electrons can be effectuated between plate 12 and the body of the individual who touches plate 10. Thus, the capacitance for this invention is provided by one's body and the plate 12 being divided by a dielectric 10. The dielectric of course can be either a plastic or any suitable insulating material or an air gap with a very thin plastic thereon.

An electronic clock or signal source 16 is shown having a grounded side 18 and an output 20. The signal source 16 should put out a signal having the slope of a step function as shown by the wave 22. Thus, in effect, the wave form 22 can be formed as a relatively square wave signal. The signal can be of any approximate square wave form. The main criteria of the signal is that it have the slope of a step function. In other words, the signal from the source should have sufficient amplitude and frequency to operate the components of the invention to be described.

The clock or signal source 16 is connected at its output to the emitter of a transistor 24. The transistor 24 has its base connected to conductive plate 12. Across the base and emitter of transistor 24 is a capacitor 26 and a resistor 28 in parallel with each other. The capacitor 26 is utilized for maintaining proper balance with regard to the capacitance of the transistor and also serves to balance out the other capacitive elements of the circuit. The resistor 28 is utilized as a biasing resistor to prevent the transistor 24 from functioning in an inappropriate manner. In other words, if the transistor 24 is supplied a leakage current from the collector to the base, the resistor 28 enables the transistor 24 to prevent the leakage current from operating the invention as will be described. The resistor 28 also acts as a discharge source for the operation of the invention as will be described.

The transistor 24 is connected at a junction point through its collector. At junction point 27, a resistor 29 is also connected which can be any effective and suitable load, as will be described. The foregoing circuit can function in a mutually reciprocal manner as to substitution of a PNP transistor for the NPN transistor. However, the operative characteristics will vary in the manner to be described.

Operation of the Basic Circuit

In operation, it is thought the basic switch functions by the plate 12 in combination with a contacting body, causing the signal from the signal source 16 to go to ground or complete the circuit to the tranistor 24 or amplifier. This is caused by the capacitive aspects of a body and plate 12, combining to form a capacitor.

The clock 16 provides a signal having an amplitude from zero to a secondary potential, and is placed on line 20 as an output of the clock at that specific potential. As previously indicated, the clock 16 should have a signal which is configured to have the slope of a step function such as a square wave form.

On the positive going signal of the clock or signal producing means 16, a positive wave form is seen at point 30 and at the emitter of transistor 24. Thus, when there is an increase in capacitance by virtue of the fact that plate 10 is touched or a body is proximate plate 12, the increase in capacitance serves to drive electrons in the direction of the clock 16. The increased capacitance also effectively drives electrons toward the base of the transistor 24 causing the transistor emitter to conduct. When the NPN transistor that is emplaced in this circuit functions, it effectively turns off through a back-biasing effect.

It should be noted that transistor 24 in this case is an NPN transistor. With a PNP transistor the same effect is caused when the clock or signal source 16 goes negative. In the given showing of FIG. 1 when the clock 16 goes negative with the NPN transistor, electrons flow from the emitter to the base of the transistor. This is due to the fact that the capacitor is more positively charged than the clock or signal source 16. Thus, the foregoing increase in capacitance biases the transistor 24 in an on condition allowing electrons to flow to the load or collector and load.

As an aside, it should be noted that the resistor 29 can be any particular load on the line.

The resistor provides a load and bias for the collector of transistor 24. The load or resistor 29 should be tied to a positive source to properly bias the transistor 24. If a PNP transistor is utilized, the resistor 29 or load should be tied to a negative source to properly bias the PNP transistor.

Resistor 28 allows a discharge path from the capacitance element 11 to the clock 16 as well as a drain for leakage from the collector to the base of transistor 24. As previously mentioned, the capacitor 26 merely balances out the capacitance in the transistor 24 and the capacitance element 11 comprising cover 10 and plate 12 as well as any other stray capacitance.

It should be noted that the line frequency source or the general rate of change from zero to a positive wave form, or any other suitable limit as to value and polarity can be provided by any suitable signal producing means. However, the wave form should be substantially the slope of a step function because the impedance of the capacitive detecting element 11 is inversely proportional to the rate of signal change. In other words, as the rate of change or the slope of the wave form increases to the point of a square wave, the impedance of the capacitive element 11 decreases. As a consequence, low rates of change in circuit frequencies will not provide the sensitivity of the given circuit.

Alternative Circuit Embodiments

The clock or signal means 16 can be utilized to provide a signal of a suitable voltage to operate the entire circuit. This is shown generally in FIG. 4 and will be described in greater detail with respect to that figure. Although the basic switch as shown in FIG. 1 does not utilize the voltage provided by a clock or signal source 16 as in other embodiments of this invention, it should be kept in mind that such a function of the signal source can be utilized in the broadest aspects of this invention.

Looking at FIGS. 2 and 3, a touch plate or cover similar to plate 10 is shown. For ease of reference, touch plate 10 and conductive plate 12 will be designated with like numerals in the other figures since they are utilized in a similar manner as that of FIG. 1. A space 14 is utilized to provide an air gap or any other suitable dielectric can be used if the cover 10 does not have sufficient dielectric strength. Thus, the switch elements of the remaining figures are analogous and provide the capacitance registering function of the total element 11 in a similar manner. It should be noted that the cover or touch plate 10 must be designed to the proper thickness to create the required operative capacitance between conductive plate 12 and a proximate body. In like circuits with like values the cover plate 10 can be of suitable thickness and contact conductive plate 12, or the like dielectric requirements can be provided by a thin plate 10 and an air gap.

Looking more specifically at FIG. 2, a modification of the transistor 24 is shown as an amplifier. FIGS. 2 and 3 are alike insofar as the amplifier terminology is concerned but for the fact that the showing of FIG. 2 details the amplifier in greater measure. The amplifier configuration shown in FIG. 3 and labeled 40 is analogous to the dotted area of FIG. 2 and labeled 40. The configuration of amplifier 40 provides an amplifier which is in push pull relationship and has greater capability. Thus, the ammplifier 40 can compensate for temperature as well as other changes beyond the capability of the mere transistor 24.

As can be seen in both FIGS. 2 and 3 the touch or cover plate 10 and the conductive plate 12 have a space 14 therebetween. As in the previously described embodiment, a dielectric such as a thicker non-conductive plate 10 can be utilized instead of air gap 14. The device of FIG. 2 which is in effect a more sophisticated version of that of FIG. 1 has two NPN transistors 42 and 44 operated in push pull relationship. A resistor 46 serves the same function generally as resistor 28. Resistor 48 serves to bias the emitters of the transistors 42 and 44 so that they operate in a push pull manner.

A second transistor 50 is utilized which is a PNP transistor and serves to more fully drive the system. Biasing resistors 52 and 54 are utilized to effectively bias the circuit. A capacitor 56 is utilized to balance out the capacitance in the system. It can be seen that FIG. 3 is the same device generally as shown in FIG. 2 and incorporates biasing resistors 62 and 64 with a third resistor 60 utilized in the same mode as the resistor previously described which can also be analogized to the function of resistor 28 in the embodiment of FIG. 1. A balancing capacitor 66 is used to cause the amplifier circuitry 40 which has inherent capacity therein to be compensated for as well as other capacitances in the circuit. The generation of a signal in FIGS. 2 and 3 is from a clock or other suitable signal source having respective lines 68 and 70 which are the respective output lines of the switch and input lines of the clock or signal source. The ground potential of the circuit is generally along lines 72 and 74 of the respective circuits of FIGS. 3 and 2 with the positive side indicated as such in the upper portion of the circuits.

The supply signal or wave form of the clock can be the wave form generally shown as the unsquared wave 76 or the relatively square wave 78. For optimum operation the slope should be that of a step function.

Looking more specifically at FIG. 4, a circuit of this invention is shown having a touch or cover plate 10 similar to the previous embodiments and a second conductive plate 12 so that a capacitive element 11 is created when a body is proximate conductive plate 12. In this embodiment the clock or signal producing means is the power supply for the entire switch. The signal is brought into the circuit on line 80 and out therefrom on line 82.

The signal voltages should be approximately 3 volts and up in order to provide the appropriate power for the system. The conductive plate 12 is coupled at a junction point to a differential amplifier 92.

The device of FIG. 4 is much the same as FIG. 2 and 3 except for capacitor 94. Capacitor 94 is utilized for holding down transient spikes from the signal source. It should be appreciated that the output of the clock or signal source 82 is provided in such a manner as to form transient spikes because it is supplying the supply voltage. The transient spikes are substantially eliminated by placement of the capacitor 94.

A second capacitor 96 functions in the same mode as the other capacitors in the previous circuits to compensate for capacitance in the circuit. A resistor 98 is provided to bias the amplifier in a normally off position. Resistors 100 and 102 act as feeding resistors for the circuit in order to effectively feed the clock signal into the differential amplifier to cause it to operate in the mode that the semi-conductors operate in most favorably. In other words, resistors 100 and 102 are biasing resistors to effectively aid the operation of the semiconductors of the differential amplifier 92. The resistors of FIG. 4 are basically the same as those of FIG. 2. Specifically, resistors 52 and 54 are analogous to resistors 100 and 102.

Thus, in operation, the showing of FIG. 4 is the showing of a device which will operate with a differential amplifier with all the specific advantages thereof and at the same time utilize the clock or signal source as a source of power for the circuit.

In summation, the basic operation of the above devices involves a comparison of the substantially instantaneous voltages or potentials on the capacitor plate 12 and the clock or signal source voltage. As can be seen, there is a commonality of resistive loads in all of the circuits of the foregoing embodiments. In essence, an amplifier is placed across the respective resistors 28, 46 and 60 to compare the substantially instantaneous voltage between the clock and the capacitor plate 12 and amplify that for purposes of creating an appropriate signal using devices 24, 40 and 92.

It should be highly emphasized at this particular point, that the invention does not rely upon amplitude changes. Importantly and most significantly, it relies upon changes in frequency or a change in the slope of a step function. The invention changes the slope of the step function and in effect acts as a slope differentiator. A slope differentiator effectively causes the operation of the invention. The invention incorporates a step function or a potential level which goes from one voltage to another within a certain time frame. The amplitude stays substantially constant. The signal goes to a secondary path which is compared against the input and the difference is the output. In other words, the slope increases at a lesser rate with increasing capacitance. This is most important because of the fact that the amplitude is not changing in this case, but rather only the rate of rise, or the frequency.

Transducer Modes and Configurations

Looking more specifically at FIG. 5 a transducer combined with the foregoing circuitry of this invention is shown. The transducer can be utilized in the circuits of FIGS. 1, 2, 3, 4 and 6. The transducer of FIG. 5 can be operated as a motion switch utilizing the capacitive characteristics of the device. Specifically, plunger 107 can be moved to create an electrical signal corresponding to mechanical movement of plunger 107. Furthermore, the plunger 107 can be spring loaded to return to an original setting.

Specifically, the transducer of FIG. 5 comprises a plunger 107. An outer metallic casing 108 is shown circumscribing an inner casing 110. The casings are cylindrical and positioned in axial relationship with respect to each other.

The inner casing 110 is preferably made of an insulating dielectric and can be of a ceramic, plastic or Teflon material for smooth mechanical operation. The inner plunger 107 is a metallic plunger which can move in a suitable axial manner between the walls 110 of the inner cylinder.

Connected to the outside of the metal tube 108 is a connection or lead 112, which connects to the point where the conductive plate 12 of the capacitive element 11 would normally be connected to the circuits shown in FIGS. 1, 2, 3, 4 and 6. The plunger 107 can be connected to a sliding collar or contact by any suitable means which is generally shown as the connection 114. The connection 114 should connect with an effective ground or lower potential than connection 112 to create a situation where displacement of plunger 107 will trigger the operative change in capacitance effect. In some instances, a mere collar around the periphery of plunger 107 can effectively create sufficient ground beneath the potential of the plunger to cause the desired capacity change in the eventuality such a connection is desired.

Figures 6, 7, 8, 9, 10, 11, 12, 13, 15:
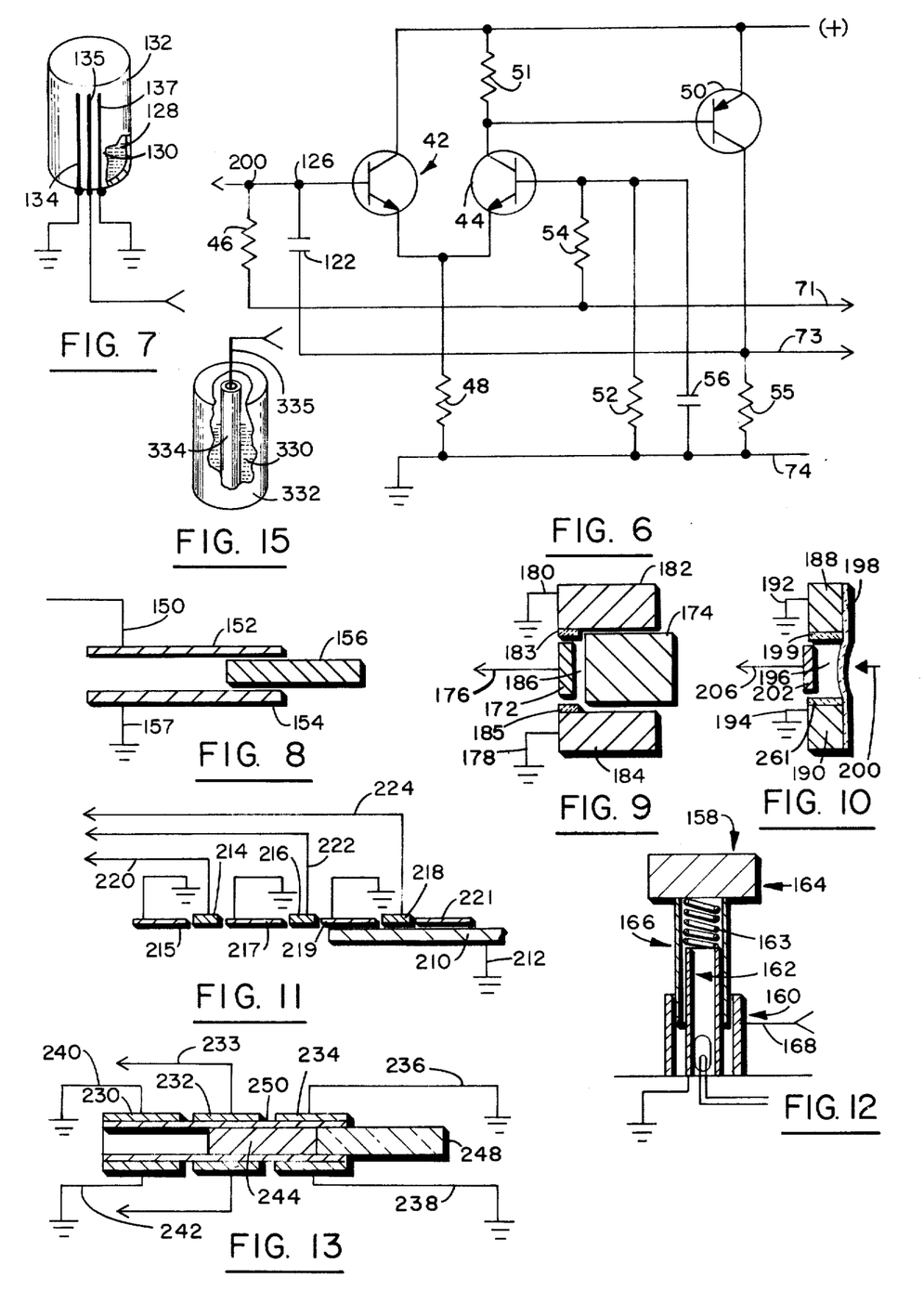

Looking more specifically at FIGS. 6 and 7, a transducer is shown connected to an operative circuit of this invention. The connection of the transducer of FIG. 7 to the circuit of FIG. 6 is similar to that of the previously described transducer connections to the various circuits of FIGS. 1, 2, 3 or 4.

The circuit of FIG. 6 has a differential amplifier system comprising NPN transistors 42 and 44. The circuit of FIG. 6 has a capacitor 122 which is substantially the only difference in components between the showing thereof and FIG. 2 which has been labeled in part with similar numerals. The circuit of FIG. 6 utilizes the capacitor 122 for purposes of effectively creating a closed loop amplifier or what is commonly known as an operational amplifier. Thus, the capacitance of a transducer operates to provide an initial input to feed the amplifier. In effect, the capacitor 122 is a feedback capacitor of the type utilized for feedback from the output, to the negative input of the differential amplifier.

In FIG. 6 a summing amplifier has been provided at the negative input with respect to the positive input. The change of capacity of a transducer such as that of FIG. 7 causes a change at the summing point 126. The summing causes a change of either positive or negative current depending upon the way the clock or signal source is impressed on lines 71 and 73. In other words, when the clock or signal source is going positive or negative it provides a respective positive or negative change at the summing point 126. The change is proportional to the capacitance as it relates to the total capacity and not necessarily the change in incremental discrete changes of capacitance. Any capacitance increase which is a discrete output of the total proportionate change is reflected at the summing point 126 as a total.

An alternative embodiment of a transducer of this invention is shown in FIG. 7 connected to the circuit of FIG. 6. The transducer measures the differences in a column of liquid 128 having a level 130. The liquid level 130 is shown inside of a non-conductor or plastic tank 132. The tank 132 serves as an insulator for the pickups of the circuit. Conductors 134, 135 and 137 can be placed on the outside of the tank in any suitable manner. Conductors 134 and 137 are connected to a lower potential or grounded with respect to conductor 135. Conductor 135 is connected to the inputs of the circuits in an analogous manner as the conductive plate 12 is connected to the circuit of 1, 2, 3 and 4. In the specific showing it is seen that conductor 135 is connected to the circuit of FIG. 6 at point 200.

It should be noted that if the tank 132 is not insulated the conductor 135 or the transducer input should be insulated from the tank so that changes of level of the liquid 128 can be reflected as changes of capacitance. The foregoing alternative embodiment of a conductive tank is shown in FIG. 15. A tank 332 is shown having a liquid level 330 with a tube 334 of nonconductive material such as glass or plastic. A conductor 335 is implaced in the tube 334 and connected to the circuits in a similar manner as conductor 135, to point 200.

The foregoing configuration enables detection of the level 330 of material in the tank 332 whether it be liquid or bulk materials.

Looking at FIGS. 8 and 12 and more specifically FIG. 8, a showing is made of a transducer having an output line 150. The output is connected in similar manner as plate 12 to the foregoing circuits of FIGS. 1, 2, 3, 4 and 6. The transducer of FIG. 8 comprises two divided plates, namely, plates 152 and 154. The plates can be of a metallic content as in most capacitors. A dielectric element 156 is utilized to pass between the common capacitor plate elements 152 and 154. The dielectric 156 can be moved interiorly of the plates which of course changes the capacitance of the plates in their capacitive function. The transducer of FIG. 8 has a ground connection or lower potential point on line 157 connected to plate 154.

The foregoing configuration of FIG. 8 generates a signal which is tantamount or equivalent to the change in capacitance between the plates 152 and 154. The advantage of this specific configuration is that it allows a dielectric material such as that comprising element 156 to move between two electric conductors and generate a substantially linear signal equivalent to the mechanical movement.

Looking more specifically at FIG. 12, the showing is similar to that in FIG. 8, inasmuch as a dielectric material such as a plastic plunger 158 is disposed between two plates or metallic tubular elements 160 and 162. The plunger 158 has an enlarged key surface 164. Thus, changes in capacity between or within the metallic tubular element 160 and 162 can be detected. The moving plunger 158 which is made of a dielectric can be spring biased by a spring 163 and maintained by the overlapping key surface 164. Thus, a plunger 166 of the suitable dielectric material can be utilized to move in and out between the tubular elements 160 and 162 to change the capacitance thereof.

Tubular element 160 is connected to the foregoing circuits of FIGS. 1,2,3,4 and 6 at the point where conductive plate 12 was connected by a line 168. Tubular element 162 is provided with a lower potential or grounded by line 170.

The showing of the transducer of FIG. 12 provides a switch function that can be utilized to provide a manual articulation equivalent to that of current keyboards and switches so that one when operating the switch gets the feeling of manual articulation. It is sometimes necessary to provide manual articulation for one to mentally record the fact that the switch has been tripped.

The showing of FIG. 9 is of a grounded or lower potential movable element or slug 174 which serves in combination with the plate 172 to effectively create changes of capacitance. It is well known that the distance between two plates causes a change in capacitance to increase proportionately as the distance between the plates. As a consequence, when element 174 is moved with respect to plate 172, it changes the capacitance of the device. In this manner, an output 176 can be fed to one of the previously described circuits at the points where contact plate 12 is connected whereby it causes a signal to be generated equivalent to the linear movement of block 174. The connection can be applied in any suitable manner to plate 172.

The other portion of the transducer must be grounded or placed at a lesser potential by grounds 178 and 180 which are in contact with holding blocks 182 and 184. To effectively ground the slug or element 174, it should be in sliding or electrical contact with the holding blocks 182 and 184. The slug should also be insulated by a washer or dielectric material 183 and 185. Thus, as the gap 186 increases, it effectively changes the capacitance between block or element 174 and plate 172 to provide a signal issued through line 176. It is not necessary that the plate 172 or element 174 actually move, but only that there be a relative movement between them. Furthermore, slug 174 and holding elements 182 and 184 can structurally be in the form of a tubular member or a rectangular element.

An example of the use of the device of FIG. 9 would be as a machine tool micrometer to effectively show relative distance changes by changes in capacitance. The invention effectively creates a finite measurement of the distance of movement as required in a micrometer. High accuracy readings can be made with regard to changes in capacitance between plate 172 and element 174 to provide substantial improvement over state of the art readings.

Looking at FIG. 10, a pair of support members 188 and 190 are shown in relationship to the other elements and have respective grounds 192 and 194 connected thereto. The grounded support members 188 and 190 are in electrical contact and interfaced with a deformable member 198. The same principal of operation as the device of FIG. 9 is effectuated as to changes of capacitance by a change in a space 196. This change is analogous to the change in the space 186 in FIG. 9 and is utilized for the operational features of this invention.

In operation, the deflectable or deformable grounded or lower potential plate or member 198 is utilized so that it deflects in the direction of arrow 200 to create changes in the space 196 as it relates to the distance between plate 198 and a fixed capacitance plate 202. Of course, as the plate 198 is deflected or deforms, it changes the distance thereby causing a change in capacitance between it and plate 202. Plate 198 can be formed as a bimetallic element similar to those for registering temperature change modes. Thus, the device shown in FIG. 10 can be utilized with regard to indicating changes in temperature if the plate 198 is made of a bimetal.

An analog output can be maintained from the plate 202 by a connection, lead or contact 206. The lead 206 is connected to the respective points where the conductive plate 12 is connected to the amplifying circuits previously described.

In addition to the foregoing temperature changes which can be registered by means of the device of FIG. 10 forming a bimetallic element 198, it can also detect pressure changes on the face of the plate 198. For instance, if a positive ambient pressure in the direction of arrow 200 is encountered it will cause the plate or diaphragm 198 to deform if the interior pressure in space 196 is sealed from ambient pressure. This in turn will be registered as an analog electrical output in the amplifying circuits connected to the lead or connection 206.

FIG. 11 shows this invention utilized in a coding function by virtue of the fact that a movable plate 210 with a ground lead 212 can be superimposed with respect to a series of plates or pickups designated as 214, 216 and 218. The plates 214, 216 and 218 have respective leads or contacts 220, 222, and 224 which feed into the previously described amplifying circuit of this invention at the respective points where conductive plate 12 is connected. In this manner, an electronic key or coding can be created when the movable plate 210 moves with respect to the plate 214, 216 and 218.

Lateral ground plates 215, 217, 219 and 221 function with leads to a lesser potential or ground. Thus, when the plate 210 moves over the respective capacitor plates 214, 216 and 218 they are either in an on or off condition and as a consequence, a keying or coding process can be effectuated.

FIG. 13 shows a series of axially aligned conductive cylinders 230, 232 and 234. Cylinder 234 has a pair of ground leads 236 and 238. Cylinder 230 is also grounded by means of grounds 240 and 242. The aligned cylinders are axially oriented with respect to a metallic plunger 244 which is attached to insulating material which can form a second plunger 248 so that substantial electrical isolation is provided for the plunger 244. An elongated insulated or dielectric cylinder 250 concentric with the cylinders 230, 232 and 234 underlies the foregoing cylinders and insulates the metal plunger 244 from the cylinder. A lead from cylinder 232 leads into the foregoing described circuits at the respective input points to provide the capacitive coupling into the circuit. Thus, the device will operate to register variations with respect to discrete capacitance changes analogous to linear mechanical movement as the plunger 244 moves through the cylinders 230, 232 and 234.

FIG. 14 shows a calculator keyboard 500 having a series of keys numbered from 0 through 9. The keys can be formed from the key 164 of the switch of FIG. 12 or touch plate 10. A group of circuits for registering actuation of the keys is provided in binary form and numbered 1, 2, 4 and 8. The diode decode matrix when the keys are actuated causes the circuits such as those of FIGS. 1, 2, 3, 4 and 6 to provide a singular or combined electrical signal equivalent to the numbered key.

The circuits of the binary system can be provided with a signal source from a single clock 16 which feeds them in parallel. Of course, the signal can be provided in parallel on a time basis sequence, or in any other manner. Regardless, it should be noted that the switch function only requires a single clock or signal source which can be inherent within the remainder of the apparatus aside from the foregoing amplifiers of FIGS. 1, 2, 3, 4 and 6. In other words, when a computer, or calculator having a built in clock is utilized with the switch or keys of this invention, the clock can be utilized in lieu of the clock of the foregoing circuits.

Touch Sensitive Cathode Ray Tube Switch

Referring back again to FIG. 1, it can be seen that a switch having a metallic or conductive surface 12 is utilized with a dielectric material 10. The touch sensitive metallic material can be screened or deposited, such as by vacuum deposition or any other metallic deposition process on the back of a clear plastic or glass material forming a panel. Some glass currently has tin oxide and other materials on it in order to provide for reflectivity or a one-way viewing effect.

The foregoing panel can effectuate a touch sensitive Cathode Ray Tube (CRT) that has visibility through the dielectric material 10 and the metallic deposition 12. It has been found that the utilization of a plastic or glass overlying the Cathode Ray Tube itself can provide a switching function with discrete metallic contact locations 12. Specifically, lines or different grid locations can be formed by the dielectric material 10 by depositing the metallic substance 12 in such a manner.

For instance, lines can be utilized going across the plastic or glass material that are metallized. The lines can indicate a switch area on the plate or panel overlying the CRT so that when a particular language or format is presented on the CRT, a control or positive response thereto can be made by touching a switch area visually connected therewith. For example, if a series of questions or questionaires are provided for a medical examination on a CRT, a person being questioned can respond to them by touching an area of the dielectric cover 10 having the metallic switch portion thereunder for activating the appropriate response. It has been known that questionaires in the form of various answers have been presented to patients whereby they are to answer one of five questions, for example, in the positive or negative, or are to indicate a certain condition. As a consequence, the questionaire can be presented and a record made of the answer with respect to what position is touched that related to the particular question. The answer is then recorded on a computer that can be interfaced with the questionaire on the CRT and the computer to correspond with the question.

The CRT can have a metallic substance deposited on its face, with an overlying dielectric material substantially similar to the dielectric material 10. In other words, a thin film of metal 12 can be placed on the CRT and the dielectric 10 utilized therewith in the form of a sheet, such as a plastic heat setable thermoplastic set thereover.

In addition to the foregoing, a touch sensitive CRT can be utilized wherein the metallic portions 12 comprise a series of areas in a matrix or grid across the entire screen. On a 10 by 10 inch screen, a series of metallic matrixes 12 which are underlying the dielectric material 10, can be utilized wherein they are all connected through a decoding scheme. In other words, the requirement for having a switch for each particular metallic position 12 on the screen of the dielectric material 10 is not required. The unit can be utilized, wherein a decode matrix similar to the one shown in FIG. 14 utilizes a limited amount of switches. In other words, it is possible to decode the XY coordinates of the position of the respective metallic conductors 12 in any particular array by a decoding matrix.

It has been found that the cathode ray tube sometimes provides a space charge or interference with the capacitive coupling on the metallic material 12. As a consequence, the foregoing can be grounded out by utilization of a protective screen between the metallic substance 12 and the Cathode Ray Tube by either having a grid, or clear metallic material for pulling off the space charge.

As can be appreciated, the foregoing switch plate cover for a CRT can effectively be coupled to any particular computer or matched to the information which is on the Cathode Ray Tube. As a consequence, control of the material on the CRT such as searching for microfilm, or other functions, can be utilized. In addition thereto, commands relating to the language on the CRT can be utilized, as well as the transmission of signals related to the language on the CRT as long as the switches on the plate 12 correspond and provide the appropriate signals interfaced electrically therewith.

Multi-Grid Embodiment

In order to provide a multi-positioned grid embodiment with simplified circuitry, a CRT can be used with a conductive plate. In such an embodiment, a conductive surface 12 is utilized with a non-conductive cover plate such as a dielectric 10. The conductive material 12 is exposed to the CRT so that is receives the electromagetic emissions at the point where the CRT emanates its particular display. Specifically, if a letter of any other form or character is emanated from the CRT, it provides electromagnetic emissions coincident to the specific displaay on the CRT The conductive plate receives the emissions coincident in time and position with the display on the CRT. Placing a finger over the conductive surface separated by a dielectric 10 causes reduction in the output signal from the conductive plate 12 which is coincident with the CRT display providing the information. This effectuates a switch function coincident with the point of CRT's scan, which of course, can be compared with the CRT control voltages to obtain a corresponding position.

The electronic beam of the CRT causes a visible and electromagnetic projection from the surface of the CRT. By placing a conductive surface 12 in front of the CRT, the signal coming from the conductive surface 12 is therefore coincident with the electronic beam of the CRT.

It should be appreciated that various other embodiments of this invention can be utilized, incorporating the circuits disclosed herein for switching or transduction purposes in any array. As a consequence, this invention is only to be read and defined in light of the scope of the following claims.

I claim:
1. A switch comprising:
   a capacitive registering element having a conductive surface for purposes of acting as a capacitive element in conjunction with a second body placed in proximity thereto;
   a means for generating a signal having sufficiently the slope of a step function to cause the switch to function as a slope differentiation detector with respect to the second body placed in proximity to said capacitive registering element;
   means for connecting said conductive surface of said capacitive registering element to said signal generation means so that a change in capacitance between said capacitive registering element and a second body will change the rise time of the slope;
   an amplifier connected to said conductive surface and said signal means; and,
   an electrical load connected to said amplifier.
2. The switch as claimed in claim 1 wherein: the amplifier is a transistor; and,
   the emitter of said transistor is connected to said signal generating means, and the collector of said transistor is connected to said load.
3. The switch as claimed in claim 2 further comprising:
   a capacitor connected across the base and emitter of said transistor
4. The switch as claimed in claim 2 further comprising:
   a resistor placed across the base and emitter of said transistor.
5. The switch as claimed in claim 1 wherein:
   said amplifier is a differential amplifier.
6. The switch as claimed in claim 1 wherein:
   said means for generating a signal provides the power to said amplifier.
7. The switch as claimed in claim 1 further comprising:
   the combination device of at least a second switch having the elements of the switch in claim 1 wherein said means for generating a signal is in singular form and utilized for both switches by being connected in parallel thereto.
8. The combination device as claimed in claim 7 wherein:
   said switches are connected to a keyboard formed with the capacitive coupling elements therein as its keys; and,
   a diode decode matrix is interposed between said capacitive coupling elements and the remainder of the switches.
9. A transduction device comprising:
   a capacitive registering element having a first conductor capable of being capacitively coupled to a second body wherein said first conductor is suitably exposed for increases in capacitance with respect to an external body;
   a differential amplifier connected to said first conductor of said capacitively coupled element;
   a signal production means producing a signal having a substantially rapid rise or fall time connected to said differential amplifier so that said differential amplifier can differentiate changes in slope caused by changes of capacitance with respect to said capacitance registering element; and,
   biasing means for appropriate operation of the differential amplifier.
10. The device as claimed in claim 9 further comprising: a capacitor connected to said differential amplifier to compensate for stray capacitances within the circuit.
11. The device as claimed in claim 9 further comprising:
   a signal production means having sufficient power to operate and power the elements of said differential amplifier.
12. The device as claimed in claim 11 further comprising:
   a capacitor connected to said signal production means for reducing transient spikes emanating from said signal producing power means.
13. A device as claimed in claim 9 wherein:
   a capacitor is provided for coupling any negative feedback of the amplifier.
14. A capacitive transduction device comprising:
   a capacitive coupler having a first conductive member adapted and placed for capacitive coupling with a body that can move with respect to said first conductive member;
   a signal source providing a signal having the slope of a step function; and, an amplifier connected for amplification of a signal developed in response to the change of the slope of the step function between said capacitive coupler and said signal source.

15. A device as claimed in claim 14 wherein:

a dielectric shield is internally positioned of said first member of a dielectric material;

the body is positioned for movement within said dielectric member for purposes of providing changes in capacity;

connection means for connecting said first member of said capacitive coupler to said amplifier; and, means for providing a lower potential for said body than that of the connection point of said first member.

16. A device as claimed in claim 14 wherein:

said first member and said body are concentric cylinders.

17. The device as claimed in claim 14 further comprising:

an insulated tank designed to receive said body; said first conductive member is placed on the outside of said insulated tank;

a second conductive member on the outside of said tank to register changes in capacitance between said first and second conductive members when said body changes position in said tank.

18. The device as claimed in claim 14 further comprising:

a non-insulated tank designed to receive said body; and, said first conductive member is placed in said tank and insulated from contact with said tank and any body therein.

19. A device as claimed in claim 14 wherein:

a second conductor is placed in non-conductive relationship from said first conductive member;

said body is a dielectric for movement between said first and second conductive members;

means for connecting one of said conductors to said amplifier; and, means for coupling one of said conductors to a lower or ground potential with respect to said amplifier.

20. A device as claimed in claim 14 wherein:

said conductive member is connected to said amplifier;

a movable conductive block to change the space between said block and said first conductive plate to create changes of capacitance with respect thereto; and, a second conductor in adjacent relationship to said conductive block for providing a lower potential with respect to said first conductive member.

21. A device as claimed in claim 14 wherein:

said body comprises a deformable member placed in spaced juxtaposition to said first conductive member; and, means for maintaining the potential of said deformable members below that of said amplifier so that as the deformable member moves, it changes the degree of capacity between said spaced first conductive member and said deformable member.

22. The device as claimed in claim 14 in combination with a cathode ray tube further comprising:

a dielectric material for placement over said first conductive member in a manner whereby the display on the cathode ray tube can be seen through said dielectric material.

23. The device as claimed in claim 22 wherein:

said dielectric material forms a panel substantially covering a portion of the cathode ray tube.

24. The device as claimed in claim 22 further comprising:

an array of conductive members deposited on the side of said dielectric material facing said cathode ray tube to provide switch functions relating thereto; and, a decoding means for decoding the respective positions representing the respective switches.

25. The device as claimed in claim 24 further comprising:

a computer interfaced with said cathode ray tube and said positions for recording the particular location which has been touched; and, a screen between the conductive member and said cathode ray tube for eliminating interference by said cathode ray tube.

* * * * *